United States Patent
Hayashi et al.

[11] Patent Number: 5,962,085
[45] Date of Patent: Oct. 5, 1999

[54] MISTED PRECURSOR DEPOSITION APPARATUS AND METHOD WITH IMPROVED MIST AND MIST FLOW

[75] Inventors: Shinichiro Hayashi; Larry D. McMillan, both of Colorado Springs, Colo.; Masamichi Azuma, Osaka, Japan; Carlos A. Paz de Araujo, Colorado Springs, Colo.

[73] Assignees: Symetrix Corporation, Colorado Springs, Colo.; Matsushita Electronics Corporation, Japan

[21] Appl. No.: 08/610,330

[22] Filed: Mar. 4, 1996

Related U.S. Application Data

[63] Continuation-in-part of application No. 08/591,341, Jan. 25, 1996, which is a continuation-in-part of application No. 08/320,218, Oct. 11, 1994, Pat. No. 5,540,772, which is a division of application No. 07/993,380, Dec. 18, 1992, Pat. No. 5,456,945, which is a continuation-in-part of application No. 07/660,428, Feb. 25, 1991, abandoned.

[51] Int. Cl.⁶ .................................................. C23C 8/00
[52] U.S. Cl. ........................... 427/585; 427/99; 427/229; 427/252; 427/421; 118/50; 118/50.1; 118/319; 118/320; 118/326; 118/629; 118/638; 118/715; 118/724
[58] Field of Search .................................... 427/252, 421, 427/585, 229, 99; 118/50, 50.1, 319, 320, 326, 629, 638, 715, 724

[56] References Cited

U.S. PATENT DOCUMENTS

| | | | |
|---|---|---|---|
| 3,661,637 | 5/1972 | Sirtl | 117/201 |
| 4,489,102 | 12/1984 | Olmer et al. | 427/54.1 |
| 4,569,855 | 2/1986 | Matsuda et al. | 427/35 |
| 4,571,350 | 2/1986 | Parker et al. | 427/109 |
| 4,585,671 | 4/1986 | Kitagawa et al. | 427/54.1 |
| 4,683,147 | 7/1987 | Eguchi et al. | 427/54.1 |
| 4,792,463 | 12/1988 | Okada et al. | 427/126.3 |
| 4,811,684 | 3/1989 | Tashiro et al. | 427/126.3 |
| 4,888,305 | 12/1989 | Yamazaki et al. | 437/101 |
| 5,119,760 | 6/1992 | McMillan et al. | 118/722 |
| 5,138,520 | 8/1992 | McMillan et al. | 361/311 |
| 5,316,579 | 5/1994 | McMillan et al. | 118/50 |
| 5,456,945 | 10/1995 | McMillan et al. | 427/252 |
| 5,540,772 | 7/1996 | McMillan et al. | 118/50 |
| 5,620,572 | 4/1997 | Bjornard et al. | 204/192.12 |

FOREIGN PATENT DOCUMENTS

| | | |
|---|---|---|
| 233-610 | 2/1986 | European Pat. Off. |
| 59-198718 | 11/1984 | Japan |
| 60-128264 | 7/1985 | Japan |
| 62-96327 | 5/1987 | Japan |
| 62-246826 | 10/1987 | Japan |
| 63-116768 | 5/1988 | Japan |

*Primary Examiner*—Cecilia J. Tsang
*Assistant Examiner*—C Delacroix-Muirheid
*Attorney, Agent, or Firm*—Duft, Graziano & Forest, P.C.

[57] ABSTRACT

A substrate is located within a deposition chamber, the substrate defining a substrate plane. A barrier plate is disposed in spaced relation above the substrate and substantially parallel thereto, the area of said barrier plate in a plane parallel to said substrate being substantially equal to said area of said substrate in said substrate plane, i.e. within 10% of said substrate area. The barrier plate has a smoothness tolerance of 5% of the average distance between said barrier plate and said substrate. A mist is generated, allowed to settle in a buffer chamber, filtered through a 1 micron filter, and flowed into the deposition chamber between the substrate and barrier plate to deposit a liquid layer on the substrate. The liquid is dried to form a thin film of solid material on the substrate, which is then incorporated into an electrical component of an integrated circuit.

56 Claims, 7 Drawing Sheets

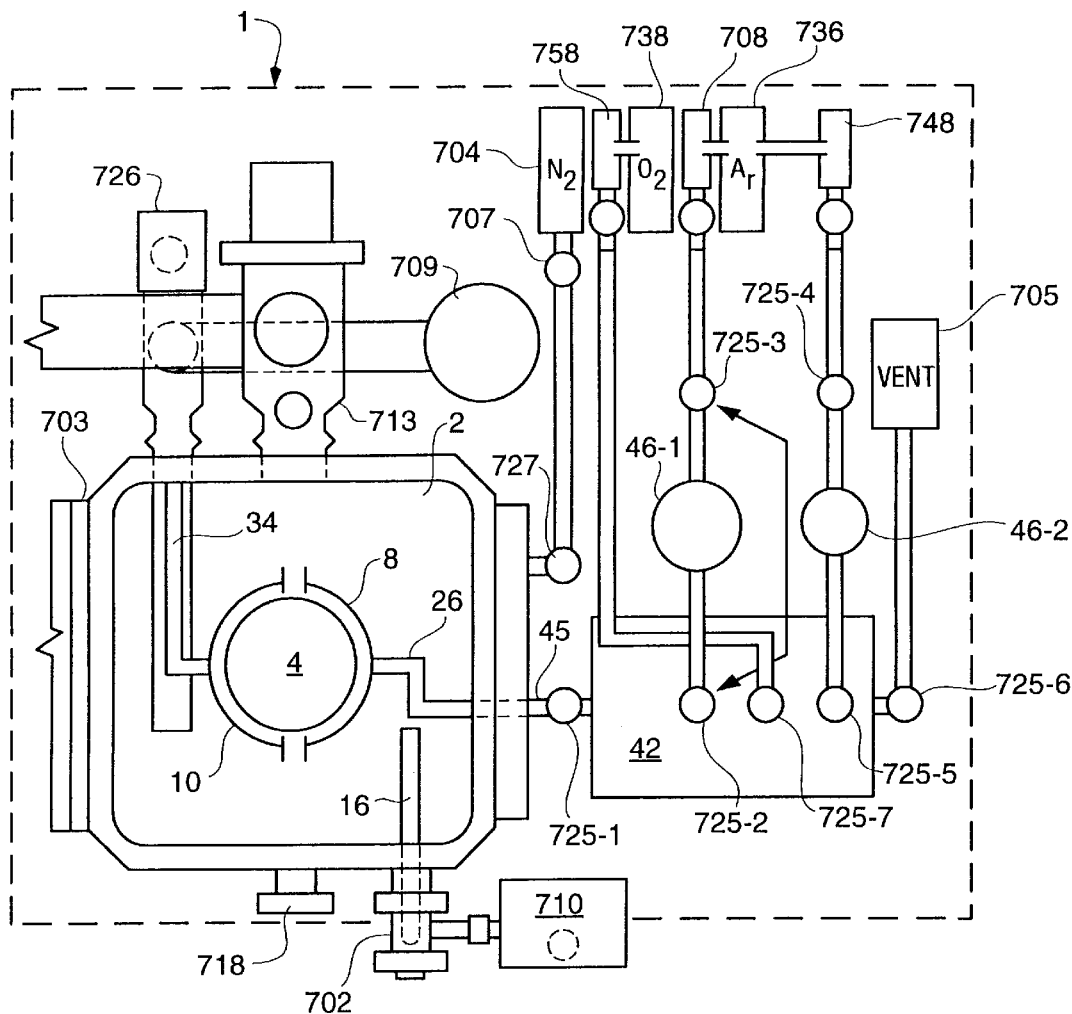
FIG. 7
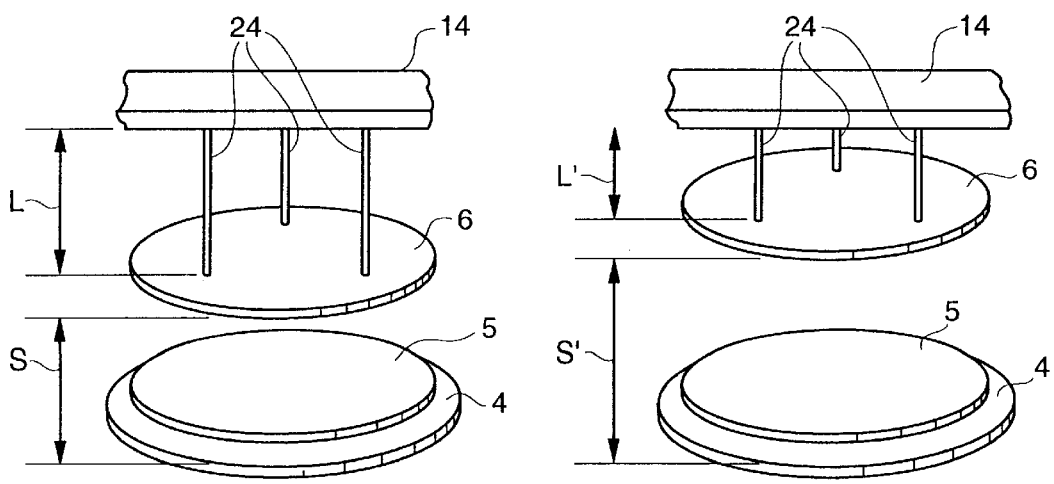
FIG. 8  FIG. 9

MISTED PRECURSOR DEPOSITION APPARATUS AND METHOD WITH IMPROVED MIST AND MIST FLOW

This application is a continuation-in-part of U.S. patent application Ser. No. 08/591,341 filed Jan. 25, 1996, which is a continuation-in-part of U.S. patent application Ser. No. 08/320,218 filed Oct. 11, 1994, now U.S. Pat. No. 5,540,772 issued Jul. 30, 1996, which is a divisional of U.S. patent application Ser. No. 07/993,380 filed Dec. 18, 1992, now U.S. Pat. No. 5,456,945 issued Oct. 10, 1996 which is a continuation-in-part of U.S. patent application Ser. No. 07/660,428 filed Feb. 25, 1991 now abandoned.

BACKGROUND OF THE INVENTION

1. Field of the Invention

The invention relates to apparatus for fabricating thin films of complex compounds that form part of electrical components in integrated circuits, and more particularly, apparatus for forming such thin films from misted liquid precursors.

2. Description of the Related Art

As is well-known in the art, the electrical components in integrated circuits are made up of layers of thin films which are connected by wiring layers and separated by insulating layers. While some of the simple materials and compounds, such as silicon glass, have been formed using a liquid deposition process, thin films complex compounds, that is, compounds containing more than two elements, in the prior art have always been formed using processes such as vacuum sputtering, (i.e., E-beam, D. C., R. F., ion-beam, etc.); laser ablation, reactive chemical vapor deposition, including metalorganic chemical vapor deposition (MOCVD); and liquid application methods using sol-gels (alkoxides) or carboxylates. However, none of these known methods have been able to produce metal oxides with properties good enough for use in integrated circuits. In all of the prior art processes, except sputtering, the films produced had significant physical defects, such as cracking, peeling, etc. It was impossible with the prior art processes, particularly sputtering, to reliably and repeatably produce metal oxides with a specific stoichiometry within tolerances required for integrated circuits. Some processes, like CVD, could be dangerous or toxic. Most required high temperatures that were destructive to an integrated circuit, and provided poor "step coverage" of a substrate to be covered; i.e., the prior art techniques resulted in a relatively excessive build-up of deposition of the film at the boundary of any discontinuities on the substrate. In prior art liquid deposition processes, it was impossible to control thickness with the degree of accuracy that is required to manufacture integrated circuits. As a result, up to now, metal oxides and other complex materials have not been used in integrated circuits except for one or two specialty, relatively expensive applications, such as the use of sputtered PZT in ferroelectric integrated circuits that were expected to have short life times.

SUMMARY OF THE INVENTION

The parent applications to the present application describe a misted deposition process and apparatus that overcomes the many problems and disadvantages associated with known processes for depositing thin films of complex chemical compounds to fulfill a great need in the art by providing a production-worthy process which can be used for easily and economically producing thin films, from a few angstroms to microns in thickness, of various complex materials, particularly metal oxides.

The parent applications describe a method and apparatus in which a liquid precursor is misted, then flowed through a deposition chamber between the substrate on which the liquid is to be deposited and a barrier plate. It discloses an injection assembly for injecting the mists into said deposition chamber in close proximity to and around the periphery of one side of said substrate and an exhaust assembly for exhausting the mists from the deposition chamber at a region in close proximity to and around the periphery of an opposite side of the substrate to create a substantially evenly distributed flow of the mist across the substrate. The substrate, barrier plate, injection nozzle assembly, and exhaust assembly collectively define a semi-enclosed area within said deposition chamber.

The present invention provides a misted deposition apparatus and method with an improved mist and an improved flow of the mist over the substrate.

The present invention improves on the misted deposition apparatus described above by making the barrier plate of substantially the same area as the substrate. Here, substantially the same area means that the area of the barrier plate in the plane of the substrate differs from the area of the substrate by only 10% or less. The barrier plate has a smoothness tolerance of 5% of the average distance between said barrier plate and said substrate. The deposited film shows better thickness uniformity than with barrier plates in which the area and tolerances are not within these parameters.

The present invention also improves on the apparatus and method described above by providing a filter through which the mist is filtered and collimated before deposition. Preferably, the filter is a steel mesh having filter openings of up to one micron. The filter is incorporated into the injection assembly. The deposited film shows better step coverage than with no filter.

The present invention also improves on the misted deposition apparatus and method described above by providing a buffer chamber through which the mist flows between the mist generator and the deposition chamber. The buffer chamber is sufficiently large so that mist particles that might cause surface morphology problems settle out before entering the deposition chamber. The buffer chamber also assists in mixing the mist if more than one mist generator is used. The buffer chamber improves the rate at which the film can be deposited without creating surface morphology problems.

The invention provides apparatus for fabricating an integrated circuit comprising: a deposition chamber; a substrate located within the deposition chamber, the substrate defining a substrate plane; means for producing a mist of a liquid precursor; and means for flowing the mist through the deposition chamber substantially evenly across the substrate in a direction substantially parallel to the substrate plane to form a film of the liquid precursor on the substrate, wherein the means for flowing includes a barrier plate disposed in spaced relation above the substrate and substantially parallel thereto, the area of the barrier plate in a plane parallel to the substrate being substantially equal to the area of the substrate in the substrate plane. Preferably, the barrier plate has a smoothness tolerance of 5% of the average distance between the barrier plate and the substrate. Preferably, the apparatus further includes means for maintaining the deposition chamber under vacuum, means for applying a DC bias between the barrier plate and the substrate, and means for adjusting the barrier plate to vary the distance between the barrier plate and the substrate. Preferably, the apparatus includes an injection nozzle assembly for injecting the mist into the deposition chamber disposed in close proximity to and around the periphery of one side of the substrate, an exhaust assembly disposed in close proximity to and around the periphery of an opposite side of the substrate from the injection nozzle assembly, and the substrate, the barrier plate, the injection nozzle assembly, and the exhaust assembly collectively define a semi-enclosed area within the deposition chamber. Preferably, the apparatus includes means for rotating the substrate in a plane parallel to the substrate plane while the mist is being deposited on the substrate and means for applying ultraviolet radiation to the mist while the mist is flowing through the deposition chamber. Preferably, the deposition chamber is maintained at substantially ambient temperature while the mist is flowed into it.

In another aspect the invention provides apparatus for fabricating an integrated circuit, the apparatus comprising: a deposition chamber; a substrate located within the deposition chamber, the substrate defining a substrate plane; means for producing a mist of a liquid precursor; and means for flowing the mist through the deposition chamber substantially evenly across the substrate in a direction substantially parallel to the substrate plane to form a film of the liquid precursor on the substrate, wherein the means for flowing includes a barrier plate disposed in spaced relation above the substrate and substantially parallel thereto, the barrier plate having a smoothness tolerance of 5% of the average distance between the barrier plate and the substrate.

In a further aspect, the invention provides apparatus for fabricating an integrated circuit, the apparatus comprising: a deposition chamber; a substrate located within the deposition chamber, the substrate defining a substrate plane; means for producing a mist of a liquid precursor; filter means for filtering the mist; and means for flowing the mist through the deposition chamber to form a layer of the precursor liquid on the substrate. Preferably, the filter means comprises a stainless steel mesh. Preferably, the mesh includes openings having an area of up to one micron. Preferably, the means for flowing comprises: an injection nozzle assembly for injecting the mist into the deposition chamber disposed in close proximity to and around the periphery of one side of the substrate; an exhaust assembly disposed in close proximity to and around the periphery of an opposite side of the substrate from the injection nozzle assembly; and the filter means forms part of the injection nozzle assembly. Preferably, the injection nozzle assembly and the exhaust assembly each includes a plurality of nozzle ports distributed about the periphery of the substrate, and the filter means comprises a filter located in at least one of the nozzle ports. Preferably, the apparatus further includes adjusting means for adjusting the flow of the mist through the nozzle ports, the adjusting means comprising threads formed in the ports formed in the injection nozzle assembly and hollow, threaded bolts which screw into the threaded ports, at least one of the threaded bolts having the filter located in the hollow head of the bolt. Preferably, the substrate is circular, the injection nozzle assembly comprises a conduit forming an arc of a circle about one periphery of the substrate, the exhaust assembly comprises a conduit forming an arc of a circle about an opposite periphery of the substrate, and the ports are formed along the arc of the conduits. Preferably, the means for flowing further includes a barrier plate disposed in spaced relation above the substrate and substantially parallel thereto and wherein the substrate, the barrier plate, the injection nozzle assembly, and the exhaust assembly collectively define a semi-enclosed area within the deposition chamber.

The invention also provides a method of fabricating an integrated circuit, the method comprising the steps of: providing a liquid precursor; placing a substrate inside an enclosed deposition chamber; producing a mist of the liquid precursor; filtering the mist; flowing the filtered mist through the deposition chamber to form a layer of the precursor liquid on the substrate; treating the liquid layer deposited on the substrate to form a film of solid material; and completing the fabrication of the integrated circuit to include at least a portion of the film of solid material in a component of the integrated circuit. Preferably, the precursor comprises a metal compound in a precursor solvent, the metal compound selected from the group: a metal alkoxide and a metal carboxylate, and a metal alkoxycarboxylate. Preferably, the step of flowing is performed while maintaining the substrate at ambient temperature and while maintaining a vacuum of between approximately 100 Torr and 800 Torr in the deposition chamber. Preferably, the step of filtering comprises passing the mist through openings having an area of up to one micron. Preferably, the step of flowing comprises injecting the precursor mist into the deposition chamber in close proximity to and around the periphery of one side of the substrate and exhausting the precursor mist from the deposition chamber at a region in close proximity to and around the periphery of an opposite side of the substrate to create a substantially evenly distributed flow of the precursor mist across the substrate. Preferably, a surface of the substrate defines a substrate plane and the mist is flowed between the substrate and a barrier plate located within the deposition chamber in a spaced relation to the substrate and parallel to the substrate plane. Preferably, the method further includes the step of passing the mist through a buffer chamber prior to the step of flowing. Preferably, the step of passing the mist through a buffer chamber is performed prior to the step of filtering. Preferably, the method includes the additional step of applying ultraviolet radiation to the mist while the mist is flowing through the deposition chamber. Preferably, the step of treating comprises applying ultraviolet radiation to the layer deposited on the substrate.

In still another aspect, the invention provides apparatus for fabricating an integrated circuit, the apparatus comprising: a deposition chamber; a substrate located within the deposition chamber, the substrate defining a substrate plane; means for producing a mist of a liquid precursor; means for flowing the mist through the deposition chamber to form a layer of the precursor liquid on the substrate; and a buffer chamber through which the mist passes, the buffer chamber located between the means for producing the mist and the means for flowing the mist. Preferably, the buffer chamber comprises a container that is sufficiently large that mist particles which can cause surface morphology problems settle out in the buffer chamber. Preferably, the means for flowing includes filter means for filtering the mist and the filter means includes openings having an area of up to one micron.

The use of the improved barrier plate, filter, and buffer chamber results in better thin films even with accelerated deposition rates, thus improving the economy of the misted deposition process. Other objects, advantages and salient features of the present invention will become apparent from the following detailed description in conjunction with the drawings.

BRIEF DESCRIPTION OF THE DRAWINGS

FIG. 1A is an enlarged view of a portion of FIG. 1;

FIG. 7 is a top view of the preferred embodiment of a misted deposition system according to the invention;

FIGS. 8 and 9 show a barrier plate assembly and substrate in two different positions to illustrate the adjustable relationship between the barrier plate and the substrate;

DESCRIPTION OF THE PREFERRED EMBODIMENT

1. Overview

Figure 6:
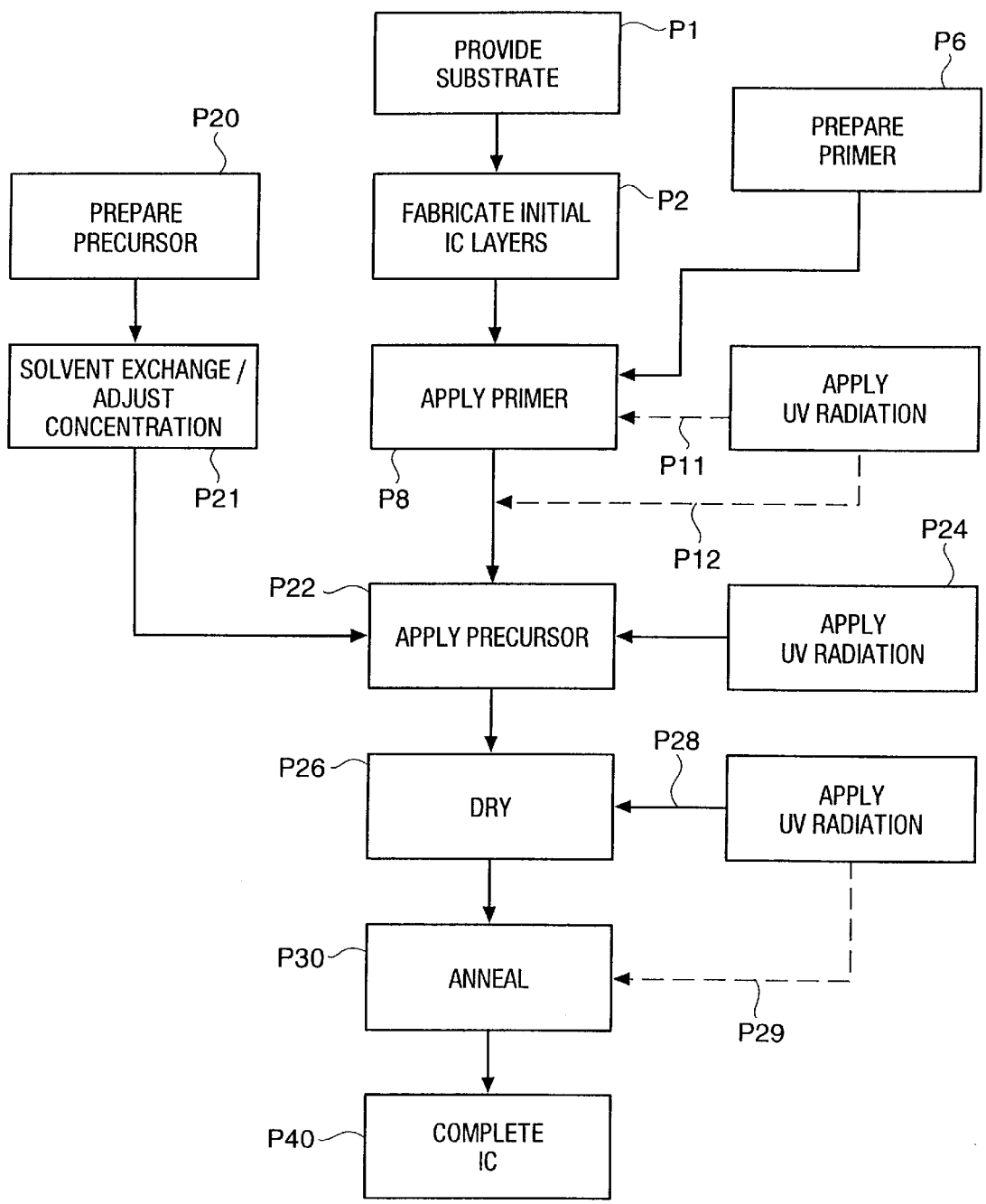
FIG. 6 is a flow chart showing the process of fabricating an integrated circuit according to the invention.
Figure 10:
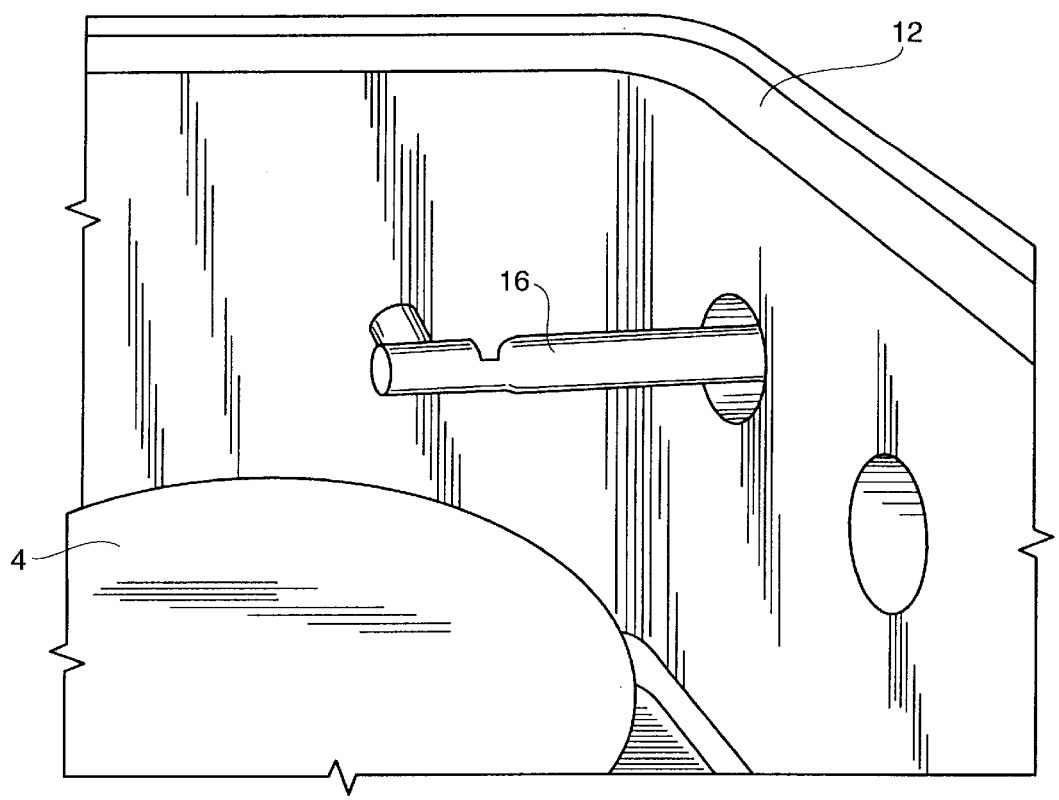
FIG. 10 is a perspective view showing the placement of the ultraviolet radiation source within the deposition chamber according to the invention.
Figure 11:
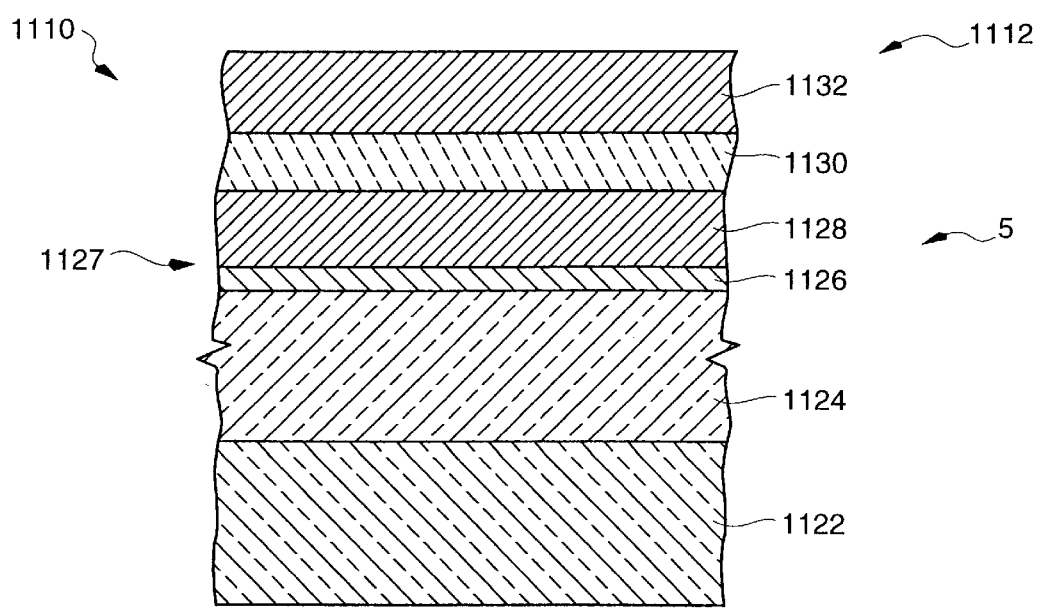
FIG. 11 shows a cross-sectional side view of a portion of an integrated circuit wafer fabricated with the apparatus and methods of the invention.

A flow chart of the preferred embodiment of a process according to the invention is shown in FIG. 6 and a portion of an integrated circuit made by the process is shown in FIG. 11. In step P1 a substrate 5 is provided. In the art, the term "substrate" is used both in a general sense in which it may be any one or a number of layers 5 of material on which a layer of interest 1130 is deposited, and in a special sense in which it denotes a silicon wafer 1122 on which an integrated circuit 1110 is formed. Unless the context indicates otherwise, the word substrate herein will indicate any object on which a layer of material is deposited using the process and apparatus of the invention. The substrate referred to as being provided in step P1 preferably comprises a P-type silicon wafer 1122. In step P2, the initial integrated circuit layers 1124, 1126, and 1128 are fabricated to form a substrate 5 on which a metal oxide layer 1130 is deposited. First, an approximately 5000 Å silicon dioxide insulating layer 1124 is wet grown. Typically, the SiO$_2$ layer is etched to form the shape necessary to create a given integrated circuit device 1112 upon deposition of appropriate layers of titanium 1126, platinum 1128, dielectric 1130, and platinum 1132. A thin layer 1126 of titanium metal is deposited on the silicon dioxide 1124, preferably by sputtering in situ, and a 2000 Å thick electrode of platinum is deposited on the titanium 1126, preferably by sputtering in situ. By "in situ" is meant that both the titanium and the platinum are sputtered without breaking vacuum. The titanium layer 1126 is optional. When used, it diffuses into the silicon dioxide and platinum and assists the platinum 1128 in adhering to the silicon dioxide 1124. A layer 1130 of a material such as PZT or BST is then deposited utilizing the apparatus and methods of the invention discussed below. Another 2000 Å layer 1132 of platinum is deposited on the layer 1130. The wafer 1110 is then annealed, patterned with a photo-mask process, and etched down to the electrode layer 1128 to produce capacitor integrated circuit devices 1112, one of which is shown in cross-section in FIG. 11, which devices are tested by connecting one lead of the test device to the platinum electrode layer 1128 and contacting the other electrode layer 1132 with a fine probe connected to the other lead of the test device.

In step P6 a primer is prepared. In the preferred embodiment, this step comprises providing a quantity of a single solvent, such as 2-methoxyethanol, xylenes or n-butyl acetate, though it may include the step of combining several solvents, such as the three foregoing solvents. The preferred solvent, whether it be a single solvent or a combination of solvents, is the final solvent of the precursor, that is, the solvent of the precursor that is applied in step P22, which will be described below. Some solvents that may be used as the primer, together with their boiling points, include: alcohols, such as 1-butanol (117° C.), 1-pentanol (117° C.), 2-pentanol (119° C.), 1-hexanol (157° C.), 2-hexanol (136° C.), 3-hexanol (135° C.), 2-ethyl-1-butanol (146° C.), 2-methoxyethanol (124° C.), 2-ethoxyethanol (135° C.), and 2-methyl-1-pentanol (148° C.); ketones, such as 2-hexanone (methyl butyl ketone) (127° C.), 4-methyl-2-pentanone (methyl isobutyl ketone) (118° C.), 3-heptanone (butyl ethyl ketone) (123° C.), and cyclohexanone (156° C.); esters, such as butyl acetate (127° C.), 2-methoxyethyl acetate (145° C.), and 2-ethoxyethyl acetate (156° C.); ethers, such as 2-methoxyethyl ether (162° C.) and 2-ethoxyethyl ether (190° C.); and aromatic hydrocarbons, such as xylenes (138° C.–143° C.), toluene (111° C.) and ethylbenzene (136° C.).

In step P8 the primer is applied to the substrate 5. In the preferred embodiment, to be described in detail below, the primer is misted, is screened through a mesh filter 33, and is applied to the substrate 5 in a deposition chamber 12. The term "mist" as used herein is defined as fine drops of a liquid carried by a gas. The term "mist" includes an aerosol, which is generally defined as a colloidal suspension of solid or liquid particles in a gas. The term mist also includes a vapor, a fog, as well as other nebulized suspensions of the precursor solution in a gas. Since the above terms have arisen from popular usage, the definitions are not precise, overlap, and may be used differently by different authors. Herein, the term aerosol is intended to include all the suspensions included in the text *Aerosol Science and Technology*, by Parker C. Reist, McGraw-Hill, Inc., New York, 1983, which is hereby incorporated by reference. The term "mist" as used herein is intended to be broader than the term aerosol, and includes suspensions that may not be included under the term aerosol, vapor, or fog. Ultraviolet (UV) radiation may be applied to the primer mist as it flows into and through the deposition chamber 11, or after it is applied to the substrate 5, as shown by the dotted lines P11 and P12, respectively. However, in the preferred embodiment, these steps P11 and P12 are skipped.

It has been found that the use of a primer prior to the deposition of the precursor results in films having better morphology and lower leakage current than with no use of a primer step P8.

In step P20 a precursor liquid is prepared. The precursor is preferably a metal-alkoxycarboxylate prepared as described in U.S. patent application Ser. No. 08/132,744, which is hereby incorporated by reference, and one detailed example thereof is given below. The precursor prepared in step P20 is usually prepared in quantity and stored until needed. Just before application of the precursor, a solvent exchange step, a concentration adjustment step, or both is performed to provide an optimum precursor for the application. The solvent exchange step is described in detail in U.S. patent application Ser. No. 08/165,082, which is hereby incorporated by reference. The final precursor solution is preferably used as the sole source for the entire deposition process following the application of the primer. However, the invention also contemplates using multiple precursor sources in parallel or series. In particular, other sources may be used in parallel for doping or modifying the final desired compound.

The precursor liquids used in the present invention are stabilized solutions. Here, "stabilized" means that key oxygen-metal bonds of the desired final chemical compound are formed in the process of forming the precursor, and after such formation are stable. This has two aspects. First, the solutions do not react or deteriorate when stored over moderately long periods. Second, the bonds formed when forming the precursor remain stable throughout the deposition process and form at least a portion of the bonds in the final desired chemical compound. That is, the metal-oxygen bonds in the precursor remain stable and pass through the deposition process to form the metal-oxygen bonds of the final desired metal-oxide compound.

According to the method of the present invention, the screened mist of a precursor liquid is evenly flowed across and onto a substrate 5 at ambient temperature. Herein, ambient temperature means the temperature of the surroundings. That is, no additional heat, other than the heat from the surroundings, is applied to the substrate. When UV radiation is being applied, the temperature of the surroundings will be somewhat higher than room temperature, and when no UV radiation is being applied and a vacuum is being applied to treat the substrate, the ambient temperature can be somewhat less than room temperature. Based on the above, in general, ambient temperature may be between about −50° C. and 100° C. Preferably ambient temperature is between about 15° C. and 40° C.

As will be discussed further below, a key aspect of the flow process is that the mist is flowed across the substrate 5 via multiple input ports and exits the area above the substrate 5 via multiple exhaust ports, with the ports being distributed in close proximity to and about the periphery of the substrate 5 to create a substantially evenly distributed flow of mist across the substrate 5.

During, after, or both during and after deposition, the precursor liquid is treated to form a thin film of solid material on the substrate 5. In this context, "treated" means any one or a combination of the following: exposed to vacuum, ultraviolet radiation, electrical poling, drying, heating, and annealing. In the preferred embodiment UV radiation is applied to the precursor solution during deposition in step P24. The ultraviolet radiation is preferably also applied after deposition in step P28. After deposition, the material deposited on the substrate 5, which is liquid in the preferred embodiment, is also preferably exposed to vacuum for a period, then is heated, and then annealed. The chemistry of the UV cure process is not entirely understood. It is believed that the UV assists in disassociating the metal-oxide molecules, or other elements that comprise the desired final chemical compound, from the solvent and the organics or other fragments of the precursor compounds.

An important parameter of many complex thin films, such as ferroelectric films, is that they are generally required to be quite thin (for example, within a range of 200 angstroms–5000 angstroms). Such film thicknesses can be readily achieved by the process and apparatus according to the invention. The invention can also be used to generate much thicker films, if desired.

The invention is well-suited for the deposition of high quality thin films of compounds such as ferroelectrics, super-conductors, materials with high dielectric constants, and gems, etc. For example, the invention can be used to deposit thin films of ferroelectric materials having a general composition of $ABO_3$, including $PbTiO_3$, $Pb_xZr_yTiO_3$, $Pb_xLa_yZr_zTiO_3$, and $YMnO_3$, where Y represents any rare-earth element. In addition, the invention can also be used to deposit thin films of barium strontium titanate [$(Ba,Sr)TiO_3$], strontium titanate ($SrTiO_3$), as well as other multi-element compounds, such as those described in U.S. patent application Ser. No. 965,190, filed on Oct. 23, 1992, titled "Layered Superlattice Materials for Ferroelectric, High Dielectric Constant, and Integrated Circuit Fabrication", which is hereby incorporated by reference.

2. Deposition Apparatus

Figure 1:
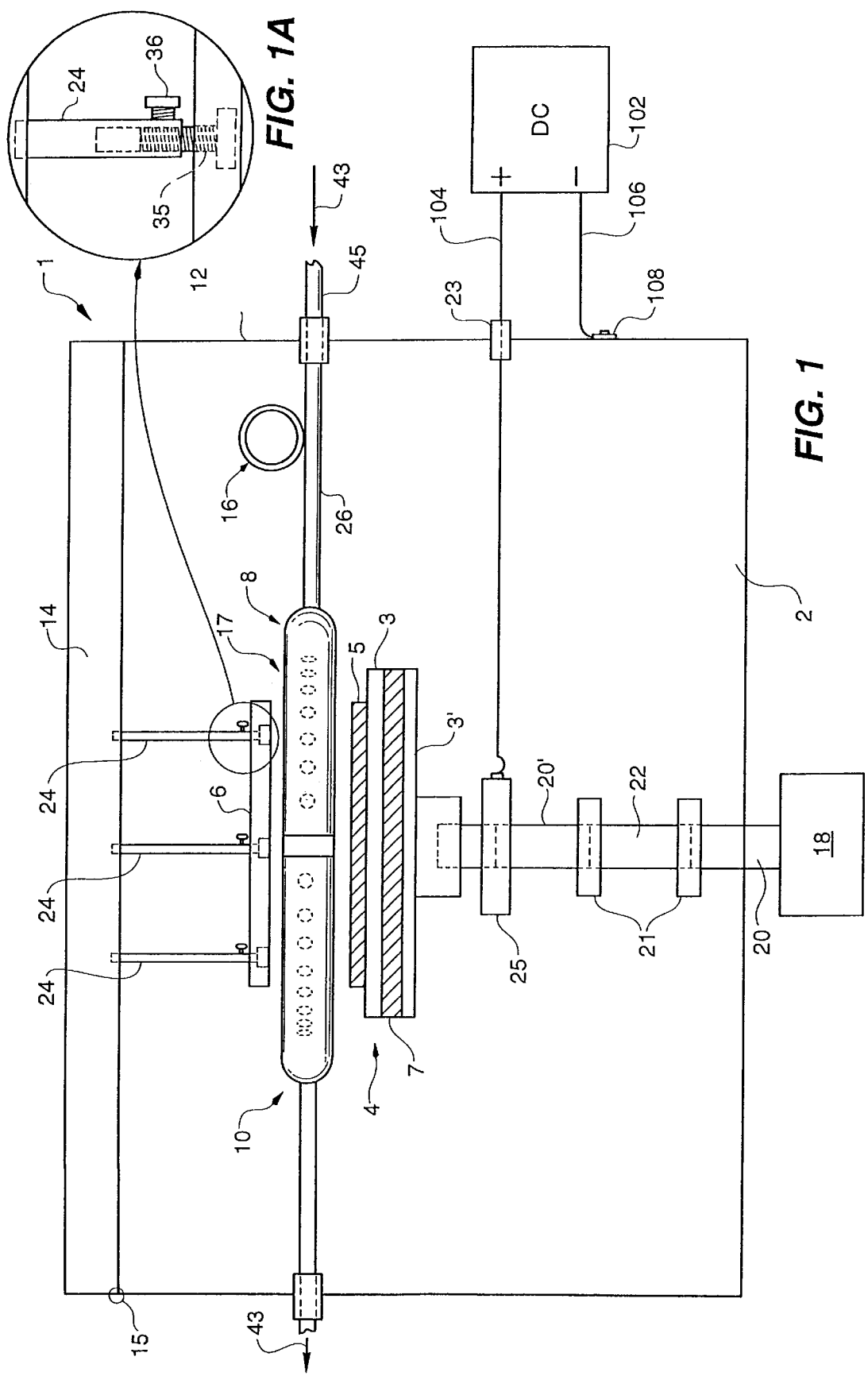
FIG. 1 is a cutaway side view of the deposition chamber portion of a misted deposition system according to the invention.

As shown in FIG. 1, there is a thin film deposition apparatus according to one exemplary embodiment of the invention, the apparatus being generally designated at 1. Apparatus 1 comprises a deposition chamber 2 containing a substrate holder 4, a barrier plate 6, an input nozzle assembly 8, an exhaust nozzle assembly 10, and an ultraviolet radiation source 16. The deposition chamber 2 includes a main body 12, a lid 14 which is securable over the main body 12 to define an enclosed space within the deposition chamber 2. The chamber is connected to a plurality of external vacuum sources described below. Lid 14 is pivotally connected to the main body 12 using a hinge as indicated at 18. In operation, a mist and inert carrier gas are fed in through tube 45, in direction 43, and pass through input nozzle assembly 8, where the mist is deposited onto substrate 5. Excess mist and carrier gas are drawn out of deposition chamber 2 via exhaust nozzle 10.

Substrate holder 4 is made from two circular plates 3, 3' of electrically conductive material, such as stainless steel, the top plate 3 being insulated from the bottom plate (field plate) 3' by an electrically insulative material 7, such as delrin. In an exemplary embodiment, utilizing a 5 inch diameter substrate 5, substrate holder 4 is nominally 6 inches in diameter and supported on a rotatable shaft 20 which is in turn connected to a motor 18 so that holder 4 and substrate 5 may be rotated during a deposition process. An insulating shaft 22 electrically insulates the substrate holder 4 and substrate 5 supported thereon from the DC voltage applied to the deposition chamber main body 12 so that a DC bias can be created between the substrate holder 4 and barrier plate 6 (via chamber main body 12). Such a DC bias may be utilized, for example, for field-poling of thin films as they are being deposited on the substrate 5. Insulating shaft 22 is connected to shaft 20 and shaft 20' by couplings 21. Electrical source 102 is operatively connected across main body 12 of deposition chamber 2 at connection 108 by lead 106 and via feedthrough 23 to brass sleeve 25 by lead 104 to effect a DC bias between field plate 3' and barrier plate 6.

Barrier plate 6 is made of an electrically conductive material such as stainless steel, and is of sufficiently large size to extend substantially over the substrate 5 in parallel thereto so that a vaporized source or mist as injected through input tube 26 and nozzle assembly 8 is forced to flow between barrier plate 6 and the substrate holder 4 over the substrate 5. Barrier plate 6 is preferably the same diameter as the substrate 5. It has been found that the best results are obtained if the area of barrier plate 6 in a plane parallel to the substrate varies from the area of the substrate 5 by 10% or less. That is, the area of the barrier plate 6 is no more than 10% bigger than the area of substrate 5 nor no less than 10% smaller than the area of substrate 5. As depicted in FIG. 1, the barrier plate 6 is preferably connected to the lid 14 by a plurality of rods 24 so that the plate 6 will be moved away from the substrate 5 whenever the lid is opened.

FIGS. 8 and 9 show barrier plate 6 located at various distances from substrate holder 4. Each of the rods 24 is typically a stainless steel rod attached to deposition chamber lid 14. Each rod 24 is bored to accommodate a bolt 35 (FIG. 1A) by which the rod 24 is attached to barrier plate 6. Each rod 24 is tapped to accommodate a set screw 36 which secures bolt 35 to the rod 24. By loosening set screw 36, re-positioning rod 24 relative to bolt 35, and then re-tightening set screw 36, the effective length of each rod is adjustable up to ½ inch without having to remove the rod 24 from the chamber lid 14. Each of the rods 24 is removable to allow sets of rods 24 of different lengths L, L', etc. to be substituted in order to coarsely adjust the corresponding spacing S, S', etc. between barrier plate 6 and substrate holder 4 (and substrate 5) depending on the source materials, flow rate, etc. For example, the rod length L may be adjusted to provide a spacing S in the range of 0.10–2.00 inches. Once in place, rods 24 are also adjustable as indicated above. Thus, rods 24, bolts 35, and set screws 36 comprise an adjusting means for adjusting the barrier plate 6. The spacing between substrate 5 and barrier plate 6 is preferably approximately between 0.35 inches and 0.4 inches when a precursor liquid of barium strontium titanate, as prepared below, is deposited. Preferably the barrier plate 6 has a smoothness tolerance of up to 5% of the distance between the barrier plate 6 and substrate 5. That is, the distance between the substrate 5 and the barrier plate 6 at any given point differs from the distance between the substrate 5 and the barrier plate 6 at any other point by 5% or less of the average distance between the substrate 5 and the barrier plate 6. For example, if the average distance between the substrate 5 and the barrier plate 6 is 0.38 inches, no point on the substrate will be more than 0.40 inches from the barrier plate or less than 0.36 inches from the barrier plate.

It has been found that a barrier plate within the tolerances described above, that is, the barrier plate has an area that is approximately the same as the substrate and a smoothness tolerance of 5% or less, provides better thickness uniformity and a higher deposition rate than barrier plates outside the aforesaid tolerances.

FIG. 7 is a top view of the apparatus of an exemplary embodiment of the invention. As shown in FIG. 7, a 0–1000 Torr temperature compensated capacitance manometer 710 monitors the pressure in deposition chamber 2, and its signal controls a downstream control valve (not shown) to maintain precise pressures in deposition chamber 2. High vacuum pump-down of deposition chamber 2 to below $5.0 \times 10^{-6}$ Torr is accomplished with valve 713 opened. High vacuum pump-down of deposition chamber 2 is used to facilitate adsorption of moisture from the chamber walls as well as from a substrate 5 located inside of the chamber, prior to a deposition operation.

Deposition chamber 2 is vacuum pumped to a pressure of between approximately 100 and 800 Torr during a deposition operation. The deposition chamber exhaust system includes a liquid nitrogen cold trap 709 connected to process chamber 2 via valve 726. Access to an external chamber (not shown) from deposition chamber 2 is provided through an air-operated slit valve 703. The interior of deposition chamber 2 can be viewed during a deposition operation through view port 718.

The precursor liquids are provided with mass flow controller 708 and VCR valve 725-3 to control the dispersion rates of precursors through buffer chamber 42 into deposition chamber 2 by regulating the flow of an inert gas such as argon from source 736 into mist generator 46-1. Additional mass flow controller 748, valve and valve 7254 are connected to mist generator 46-2 which connects to buffer chamber 42 via VCR valve 725-5 to control the dispersion rates of primers through buffer chamber 42 into deposition chamber 2 by regulating the flow of an inert gas such as argon from source 736 into mist generator 46-2. A separate mass flow controller 758 is used to introduce oxygen from source 738 and/or other inert or process-active gases into buffer chamber 42 via VCR valve 725-7.

Figure 2:
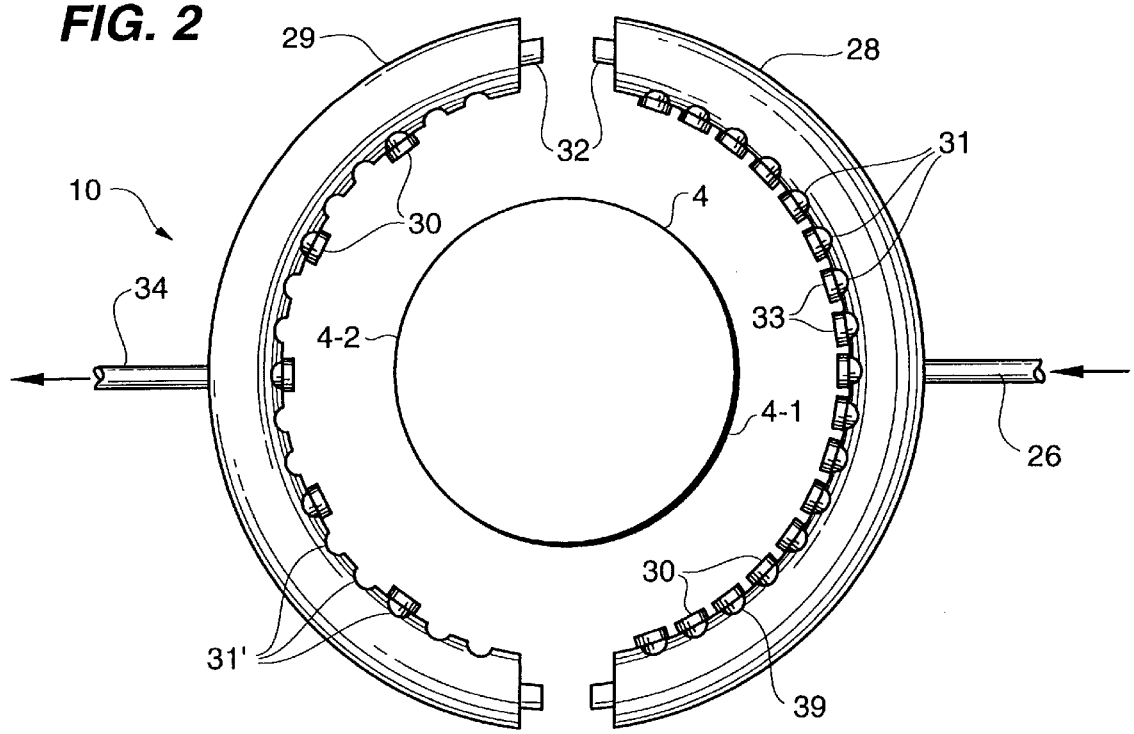
FIG. 2 is a plan view of an intake and exhaust nozzle assembly of the system of FIG. 1.

The input nozzle assembly 8 and the exhaust nozzle assembly 10 are more particularly shown with reference to FIG. 2. Input nozzle assembly 8 includes an input tube 26 which receives a misted solution from buffer chamber 42 as discussed below in relation to FIG. 5. Input tube 26 is connected to arcuate tube 28 which has a plurality of small holes or input ports 31 for accepting removable screws 30 and removable input nozzles 33 spaced ¼ inch center-to-center along the inner circumference of the tube 28.

Figure 3:
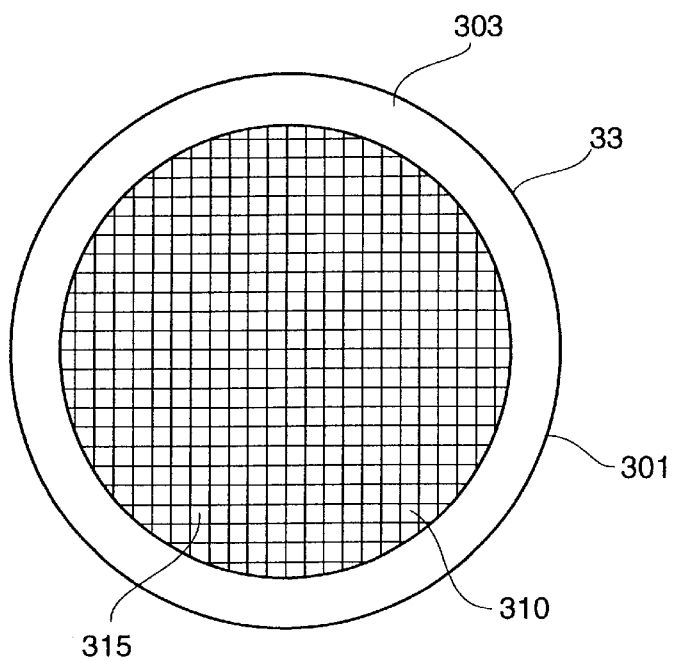
FIG. 3 is an enlarged plan view of an intake nozzle of the system of FIGS. 1 and 2.
Figure 4:
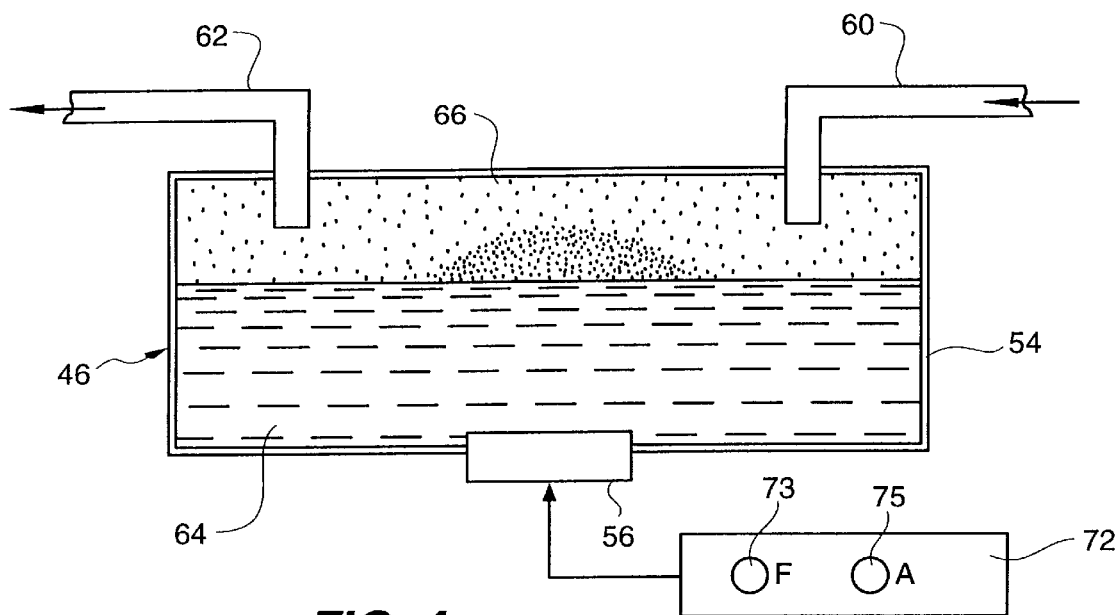
FIG. 4 is a schematic side view of a mist generator of a misted deposition system according to the invention.

A plan view of an input nozzle 33 is shown in FIG. 3. It includes a screw 33 having an enlarged, hollow screw head 301 having a rim 303, and hollow screw stem 39 (FIG. 2), and a mesh filter 310. Mesh filter 310 is preferably friction fit inside screw head 301 before the head 301 is attached to the stem 39, but also may be brazed to the outer surface of rim 303. Preferably, all portions of nozzle 33, including mesh filter 310, are made of stainless steel. Preferably mesh filter 310 is a stainless steel, woven mesh filter having spacings 315 between the mesh strands of approximately one square micron. It has been found that, with everything else being equal, the use of such a mesh filter lowers the deposition rate somewhat, but this is easily overcome by increasing the number of ports 31 and/or the size of the ports. The filter collimates the mist so that the flow of the mist over the substrate is more uniform and less turbulent, and thus there is less chance of anomalies in the flow appearing, which anomalies can create non-uniformities.

Exhaust nozzle assembly 10 comprises an arcuate exhaust tube 29 having a plurality of small holes or exhaust ports 31' with removable screws 30. The structure of the exhaust nozzle assembly 10 is substantially the same as that of the input nozzle assembly 8, except that it does not include input nozzles 33 and a tube 34 leads to a vacuum/exhaust source (not shown). End caps 32 of tubes 28 and 29 are removable for cleaning. Arcuate tube 28 of input nozzle assembly 8 and the corresponding arcuate tube 29 of exhaust nozzle assembly 10 respectively surround oppositely disposed peripheral portions 4-1, 4-2 of substrate holder 4.

In an exemplary embodiment wherein a BST film is to be deposited, the centers of holes 31, 31' in tubes 28 and 29 are nominally located 0.375 inches above substrate holder 4. However, as shown in FIGS. 8 and 9, this distance is adjustable to suit the specific deposition process.

Each of the tubes 28, 29, is typically fabricated from ¼" O.D. stainless steel, with an inner diameter of approximately 3/16'. The interior walls of each tube 28,29 are preferably electro-polished. Holes 31, 31' in tubes 28 and 29 respectively are spaced approximately ¼" center-to-center, and are tapped to accommodate 4-40 (⅛") socket head screws.

Through such structure, and by adjusting the location of nozzles 33 by selectively inserting nozzles 33 in place of screws 30 in arcuate tube 28, and adjusting the location of open exhaust holes 31' by selectively removing screws 30 in arcuate tube 29, the flow of a vaporized solution or mist over the substrate 5 can be well controlled for various solutions and flow rates, etc., to achieve a uniform deposition of a thin film on substrate 5.

Referring to FIGS. 1 and 2, substrate holder 4, barrier plate 6, input nozzle assembly 8 and exhaust nozzle assembly 10 collectively cooperate to define a relatively small, semi-enclosed deposition area 17 surrounding an upper/exposed surface of the substrate 5, and within which the vaporized solution is substantially contained throughout the deposition process.

Although exemplary embodiments of substrate holder 4, barrier plate 6, input nozzle assembly 8 and exhaust nozzle assembly 10 are shown and described, it is understood that variations of such structures can be utilized within the scope of the present invention. For example, the arcuate input and exhaust tubes 28 and 29 could be replaced with tubes of other structures such as V-shaped or U-shaped tubes, or slotted tubes, or could simply be replaced by a plurality of separate nozzles and separate exhaust ports.

Figure 5:
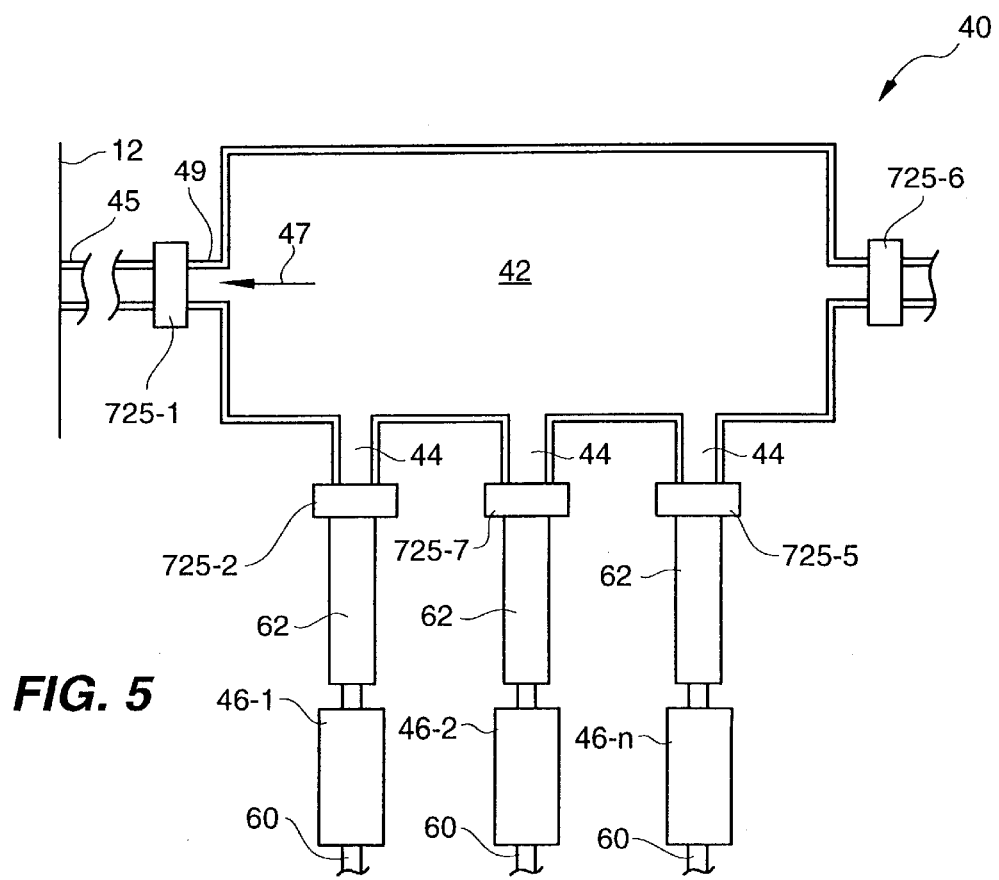
FIG. 5 is a schematic plan view of a buffer chamber and associated inlet and outlet ports according to the invention.

FIG. 5 shows a cross-sectional view of a manifold assembly 40 according to the present invention. The manifold assembly 40 is utilized for supplying a vaporized solution (mist or aerosol) to input nozzle assembly 8, and generally comprises a buffer chamber 42, a plurality of inlets 44 which are connected to corresponding mist generators through respective valves 725-2, 725-5, 725-7, a deposit valve 725-1, for regulating flow from the buffer chamber 42 to the nozzle assembly 8, and an exhaust vent valve 725-6. It is a feature of the invention that the inlets 44 from valves 725-2, 725-5, and 725-7 are at a 90 degree angle from outlet 49 to deposit valve 725-1. Buffer chamber 42 is large enough so that the mists will spend, on the average, about one to five minutes in the chamber, and, preferably, about 2.5 minutes. This time frame and the 90 degree angle between the inlets 44 and outlet 49 permits any large droplets in the mist, which can cause surface morphology problems to settle out, i.e. droplets larger than about two microns. When more than one mist is used at the same time, as for example, when both a primer and precursor are introduced together (see below), it permits the mists to mix until they form a single, homogeneous mist. In the preferred embodiment, buffer chamber 42 was preferrably a cylinder of about 3 inches in inside diameter (the vertical direction in FIG. 5) and approximately about four inches long (the horizontal direction in FIG. 5) and was made of stainless steel.

In use, one or more of the mist generators 46-* are utilized to generate one or more different mists which are then flowed into the buffer chamber 42 through valves 725-* and inlets 44.

The mists as flowed into the buffer chamber 42 are mixed to form a single, uniform misted solution which is then flowed into the deposition chamber 2 at an appropriate flow rate through the valve 725-1 and input tube 26. Valve 725-1 can be selectively closed off so that the deposition chamber 2 can be pumped down if desired, or to clean and purge the manifold system when necessary. Similarly, the outlet of the exhaust valve 725-6 is connected to a vacuum source (not shown) so that, when necessary to exhaust/purge one or more of the mist generators 46, valve 725-1 can be closed off, valve 7256 and one or more of the valves 725-6 can be opened, and the buffer chamber 42 can be pumped down to clean and purge the mist generator(s) 46 and the buffer chamber 42 by applying a vacuum via pump (not shown) or using standard negative draw type exhaust.

Stabilized precursor solutions are agitated ultrasonically to atomize or nebulize the solutions to produce a mist of the stabilized precursor solution(s) before they are introduced into the deposition chamber 2. FIG. 4 illustrates a schematic side view of an exemplary embodiment of the mist generating apparatus used in the present invention. Mist generator 46 includes a closed container 54, a TDK TU-26B or equivalent ultrasonic transducer 56 fluid-tightly and vacuum sealed into the bottom of the container 54, and a power source 72 for which both the frequency and amplitude may be varied. Container 54 is a modified Millipore Waferguard T-Line gas filter unit (catalog no. YY50 005 00) without the internal filter cartridge. The direction of gas flow as indicated by arrows 420 is opposite to that which would be used in normal operation of the filter. Transducer 56 is mounted in a recessed hole in bottom section of mist generator 46. Mist generator 46 also includes an inlet port 60 and an outlet port 62 for passing a carrier gas through the container 54. Power source 72 includes a frequency control means, i.e. frequency control dial 73, which can be turned to adjust the frequency of the transducer 56, and an amplitude control means 75, i.e. amplitude control dial 75, which can be turned to adjust the amplitude of the output of transducer 56. By adjusting the frequency and amplitude of the transducer, the particle size of the mist can be controlled. Adjusting the particle size enables one to adjust the surface morphology, step coverage, and deposition rate of the deposition process.

Before operation, a predetermined amount of precursor liquid 64 is introduced into container 54. During operation, transducer 56 is electrically activated to generate a mist 66 of the precursor liquid, and an inert carrier gas is passed into the mist 66 via port 60 where it becomes wet or saturated with the mist, and the wet carrier gas is then passed from the outlet port 62 into the manifold assembly 40. The carrier gas is normally an inert gas such as argon, helium, or nitrogen, but may comprise a reactive gas in appropriate situations.

The mist generator 46 shown in FIG. 4 is particularly advantageous because it creates a vaporized solution which can be effectively flowed or injected into the deposition chamber 2 without complications such as freezing.

FIG. 10 is a perspective view showing the placement of an ultraviolet radiation source 16 within the deposition chamber 2. Photo-enhancement of the present process is effected by providing UV (ultraviolet) light during and after the deposition process, which UV radiation is believed to stimulate the disassociation of solvent and organics from the precursor, thereby accelerating the drying process. In addition, the use of UV radiation prior to the deposition process facilitates the removal (desorption) of moisture from deposition chamber 2 as well as from substrate 5. The location of ultraviolet light source 16 within the deposition chamber is not critical because of the fact that the ultraviolet radiation is reflected off of the stainless steel walls of deposition chamber 2 into the space between the input nozzle 8 and exhaust nozzle 10, as well as onto substrate 5, where the radiation can provide the above-described photo-enhancement effect.

UV source 16 includes at least one UV lamp located in deposition chamber 2, for applying an ultraviolet radiation bath therein. Spectral sources which could be used include ultraviolet lamps and excimer lasers. In either case, the radiation bath applied by UV source 16 is tuned to optimize the dissociation of the desired chemical compound from the solvent and the organics or other fragments. In the first case, radiation emitted by an excimer laser is spectrally "tuned" to correspond to the energy needed to dissociate or crack the solvent bonds, the precursor chemical compound bonds and/or any intermediate organic complex bonds formed during the deposition process holding the desired compound in a given precursor liquid. Alternatively, if UV source 16 is a UV lamp (or plurality of lamps), then "tuning" is accomplished by exchanging one (or a set) of the UV lamps with another one (or set) of UV lamps which have a more desirable frequency spectrum.

If a ferroelectric thin film is being deposited from a vaporized alkoxycarboxylate source, as for example when depositing a precursor to form barium strontium titanate (BST) as described below, it is preferable to use a Danielson Phototron PSM-275 UV radiation source 16 which emits UV radiation rays having a wavelength of approximately 180–260 nanometers. UV radiation in this wavelength range is particularly effective in resonating and dissociating the bonds holding the BST in the vaporized alkoxycarboxylate, sol-gel, MOD, or other liquid chemical source.

Apparatus 1 shown in FIG. 1 includes electrical means 102 for applying a DC bias in the deposition chamber 2 during a deposition operation. Electrical means 102 includes DC input 104 and output 106. The DC potential applied between input sleeve 25 and deposition chamber main body 12 is typically 350 volts. The DC bias achieves poling in-situ of the ferroelectric film adding to the film quality. Dipole ordering along the crystal c-axis (the major polarization axis) is often desirable, and the resulting ordering reduces dislocation density which can be responsible for fatigue and retention problems. A DC bias of either greater than or less than 350 volts could also be used to effectuate the above results. In addition, while deposition is occurring, combinations of ultraviolet radiation and DC bias may be applied within chamber 2 either together or sequentially, and repeated.

A supplemental heating means, such as a hot plate, (not shown) may be used to bake and/or anneal a film of a precursor liquid which has previously been deposited on a substrate, the baking and annealing being preferably conducted in an auxiliary chamber, although the baking/annealing process could be performed within the deposition chamber 12, as discussed in relation to steps $P_{11}$ and $P_{12}$ of FIG. 6. The annealing is preferably performed in an oxygen furnace. High energy density ultraviolet radiation, such as from a diffused excimer laser source is also a preferred method of annealing.

3. Examples of the Process

A detailed example of the process of preparing barium strontium titanate (BST) precursors and fabricating a capacitor utilizing BST as the capacitor dielectric follows. In Table I, "FW" indicates formula weight, "grams" the weight in grams,

TABLE I $Ba_{0.7}Sr_{0.3}TiO_3$

| Compound | FW | grams | mmole | Equiv. |
|---|---|---|---|---|
| Barium | 137.327 | 9.4255 | 68.635 | 0.69986 |
| 2-ethylhexanoic acid | 144.21 | 19.831 | 137.51 | 1.4022 |
| Strontium | 87.62 | 2.5790 | 29.434 | 0.30014 |
| 2-ethylhexanoic acid | 144.21 | 8.5005 | 58.945 | 0.60107 |
| Titanium isopropoxide | 284.26 | 27.878 | 98.072 | 1.0000 |

"mmoles" indicates millimoles, and "Equiv." indicates the equivalent number of moles in solution. The quantities of materials as indicated in Table I were measured to begin step P20 (FIG. 6). The barium was placed in 100 ml of 2-methoxyethanol and allow to react. The first measure of 2-ethylhexanoic acid was added to the mixture and stirred. The strontium was then added to the mixture. Once it was finished reacting, the second measure of the 2-ethylhexanoic acid was added to the mixture. The mixture was heated to a maximum temperature of 115° C. and stirred to distill out all water. The mixture was allowed to cool. The titanium isopropoxide was added to the mixture, which was then diluted to 220 ml with additional 2-methoxyethanol. The mixture was heated to a maximum temperature of 116° C. and stirred. All isopropanol and water were then distilled out to complete step P20. In step P21, the mixture was then diluted out to exactly 200 ml with additional 2-methoxyethanol. The resultant mixture had a 0.490M concentration, wherein the ratio of Ba to Sr=0.69986:0.30014.

The chemical reactions involved in the formation of the precursor solution composed of barium 2-ethylhexanoate, strontium 2-ethylhexanoate, and titanium 2-methoxyethoxide are described below:

Example I, Barium 2-ethylhexanoate (barium metal)+(2-ethylhexanoic acid) v (barium 2-ethylhexanoate)+(hydrogen gas):

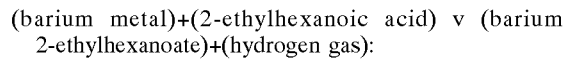

Example II, Strontium 2-ethylhexanoate (strontium metal)+(2-ethylhexanoic acid) v (strontium 2-ethylhexanoate)+(hydrogen gas):

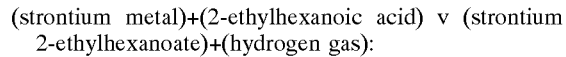

Example III, Titanium 2-methoxyethoxide (titanium isopropoxide)+(2-methoxyethanol) v (titanium 2-methoxyethoxide)+(isopropyl alcohol):

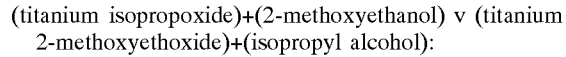

The use of 2-methoxyethanol as a solvent allows removal of any water present by distillation, as 2-methoxyethanol's higher boiling point allows it to remain behind while $H_2O$ boils away. Thus, the resulting precursor is essentially anhydrous. Barium and strontium 2-ethylhexanoate are used because thin films formed utilizing medium chain length carboxylates like these in the precursors do not crack, blister or peel on baking as do the thin films formed utilizing longer-chain carboxylates. Strontium and barium 2-methoxyethoxides were tried, but proved excessively air- and water-sensitive. Titanium 2-methoxyethoxide gives better films than the air-insensitive titanium 2-ethylhexanoate, but while titanium 2-methoxyethoxide is air-sensitive, it is less air-sensitive than titanium isopropoxide.

The BST precursor formed as described above was used in the method of the invention shown in FIG. 6, with the apparatus of the invention shown in FIGS. 1–5 and 7–10, to fabricate a capacitor as shown in FIG. 11.

A BST precursor as described above was placed in container 54 of mist generator 46-1 (FIG. 7), and a 2-methoxyethanol solvent was placed in container 54 of mist generator 46-2. Initially, a substrate comprising a silicon wafer with layers of silicon dioxide and platinum deposited on it was pre-baked in an oven at atmospheric pressure (@ Colorado Springs, Colo.) at 180° C. for 10 minutes. The substrate was placed in the deposition chamber on the substrate holder 4. The deposition chamber was pumped down to 0.4 Torr via a rough pump (not shown) connected to valve 726. Next, substrate rotation motor 18 was turned on to rotate substrate holder 4. UV source 16 was then turned on to desorb the moisture in the deposition chamber as well as any moisture on the substrate. The deposition chamber was slowly back filled via valves 727 and 707 with an inert gas source 704 such as argon or nitrogen to a pressure of approximately 595 Torr. Next, the process vacuum line 702 was opened to stabilize the deposition chamber pressure at approximately 595 Torr. Valve 725-6 was closed and injection valve 725-1 and deposit valves 725-4 and 725-5 were then opened to start the flow of argon from source 736 through ultrasonic mist generator 46-2 which was then turned on for one minute to cause a thin film of approximately 100 angstroms of primer to be deposited at ambient temperature on the substrate. Deposit valve 725-1 was then closed, valve 725-6 was then opened and the transducer 56 associated with mist generator 46-2 was turned off, to vent buffer chamber 42 through vent 705 until mist generator 46-2 reached ambient temperature. Buffer chamber 42 was purged through vent 705 by applying argon gas from source 736. Then valves 725-4 and 725-5 were closed. Deposit valve 725-1 was reopened and valves 725-3 and 725-2 were also opened to flow argon from source 736 through ultrasonic mist generator 46-1 which was then turned on for 30 minutes to cause a film of approximately 1500 angstroms to be deposited at ambient temperature on the substrate. The deposition process used argon carrier gas to flow both the primer mist and the BST precursor mist over the substrate 5. After a sufficient amount of the BST precursor was deposited on the substrate to produce a thin film, the mist generator 46-1, and the substrate rotation motor were turned off. Deposit valve 725-1 was closed and valve 7256 was opened to vent buffer chamber 42 through vent 705 until mist generator 46-1 reached ambient temperature. Buffer chamber 42 was purged through vent 705 by applying argon gas from source 736. While the wafer remained in the deposition chamber, the chamber was slowly pumped down to 0.4 Torr. The UV source 16 was then turned off. Next, valve 713 was closed and the deposition chamber was vented to atmospheric pressure. The wafer was then removed from the deposition chamber and post-baked at 400° C. for two minutes. The wafer was then annealed in an oxygen atmosphere at 800° C. for 80 minutes. The wafer was then etched using well-known photo-resist techniques to produce a plurality of electronic devices 1112. A sample made by this process is referred to below as sample A.

The above process was repeated for another sample, referred to as sample B, except that the UV radiation was applied only in step P24. That is, for sample B the UV radiation was applied to the mist while it was being deposited, but not otherwise applied to the precursor. A third process to fabricate a sample C was also performed in which the UV radiation was applied in step P28, but not applied in step P24. A fourth process to fabricate a sample D was performed in which no UV radiation was applied at any time in the process.

Figure 12:
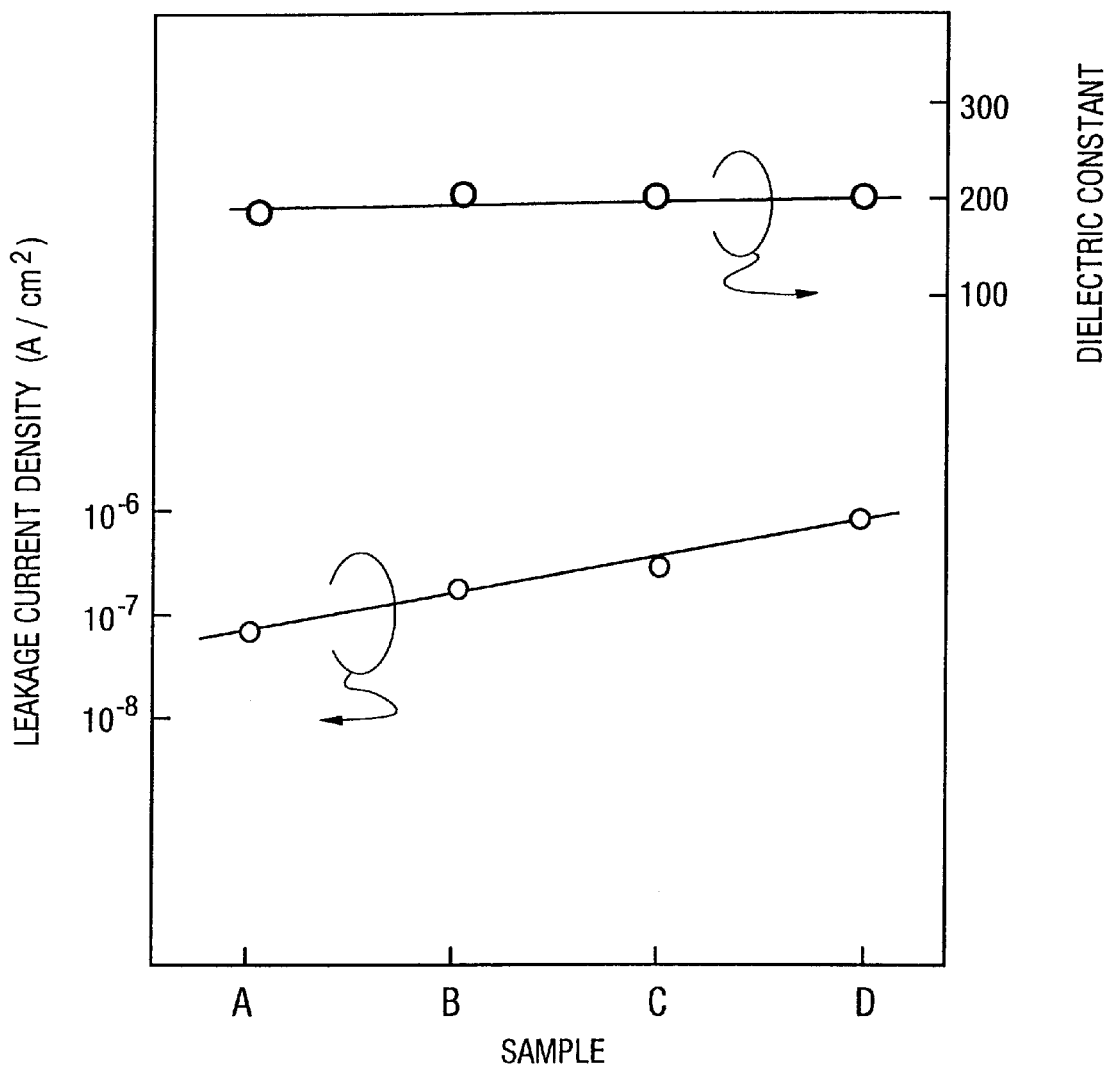
FIG. 12 is a graph of leakage current density and dielectric constant versus capacitor sample for the samples A, B, C, and D described in the specification.

The leakage current density and dielectric constant were measured for each of the capacitor samples A, B, C, and D that were formed in each of the four processes. The results are shown in FIG. 12 as a function of the sample. The leakage current density was measured for an electric field of 430 kilovolts per centimeter for each of the samples. The scale for the leakage current density is on the left in the figure, and is given in amperes per square centimeter. The scale for the dielectric constant is given on the right in the figure. The dielectric constant remained essentially the same for each sample. However, the leakage current density is less than $10^{-7}$ amps/cm$^2$ for the sample in which UV was applied both to the mist and the thin film after deposition, is less than $10^{-7}$ amps/cm$^2$ for the sample in which the UV radiation is applied to the mist but not to the film after deposition, declines slightly more for the sample for which the UV radiation was applied to the film but not to the mist, and is close to $10^{-6}$ amps/cm$^2$ for the sample to which no UV radiation was applied. The results for the second and third samples are close enough that experimental error could account for the difference, though repeating the processes with new samples suggested that the difference was real. These results indicate that use of UV in both the mist deposition process and to the thin film during the bake process improves the leakage current density by a factor of ten. Since a capacitor with a leakage current density of about $10^{-5}$ amps/cm$^2$ to $10^{-6}$ amps/cm$^2$ is marginal for use in an integrated circuit, while a capacitor with a leakage current density of less than $10^{-7}$ amps/cm$^2$ is excellent for an integrated circuit, this difference is significant.

Another deposition process was performed that was identical to the process described in the example above except that the primer step P8 was performed simultaneously with the precursor deposition step P22. That is, both mist generators 46-1 and 46-2 were turned on and valves 725-1, 725-2, 725-3, 725-4 and 725-5 were all open simultaneously, and the precursor and primer mists were mixed in the buffer chamber 42 before entering the deposition chamber 12. Then valve 725-1 was closed, the mist generators 46-1 and 46-2 were turned off, valve 725-6 was opened and both mist generators 46-1 and 46-2 were vented to atmosphere until they cooled to ambient temperature. This process also produced better morphology and better leakage current than the process with no primer, though not as good as the results with steps P8 and P22 performed separately. It is believed that when more experience with the deposition process parameters is gained with this process, It may become the preferred process.

The invention is advantageous in depositing complex, thin films of materials such as ferroelectrics, superconductors, materials with high dielectric constants, gems, etc., but is not limited to depositing such complex thin films.

Although there has been described what is at present considered to be the preferred embodiments of the present invention, it will be understood that the invention can be embodied in other specific forms without departing from the spirit or essential characteristics thereof. The present embodiments are, therefore, to be considered in all aspects as illustrative and not restrictive. The scope of the invention is indicated by the appended claims rather than the foregoing description.

What is claimed is:

1. Apparatus for fabricating an integrated circuit, said apparatus comprising:
   (a) a deposition chamber;
   (b) a substrate located within said deposition chamber, said substrate defining a substrate plane;
   (c) means for producing a mist of a liquid precursor; and
   (d) means for flowing said mist through said deposition chamber substantially evenly across said substrate in a direction substantially parallel to said substrate plane to form a film of the liquid precursor on said substrate, wherein said means for flowing includes a barrier plate disposed in spaced relation above said substrate and substantially parallel thereto, the area of said barrier plate in a plane parallel to said substrate being substantially equal to said area of said substrate in said substrate plane and said barrier plate having a smoothness tolerance of 5% of the average distance between said barrier plate and said substrate.

2. The apparatus of claim 1, including means for maintaining said deposition chamber under vacuum.

3. The apparatus of claim 1, including means for applying a DC bias between said barrier plate and said substrate.

4. The apparatus of claim 1 wherein said means for flowing further includes means for adjusting said barrier plate to vary the distance between the barrier plate and said substrate.

5. An apparatus as in claim 1 and further including:
an injection nozzle assembly for injecting said mist into said deposition chamber disposed in close proximity to and around the periphery of one side of said substrate;
an exhaust assembly disposed in close proximity to and around the periphery of an opposite side of said substrate from said injection nozzle assembly; and wherein
said substrate, said barrier plate, said injection nozzle assembly, and said exhaust assembly collectively define a semi-enclosed area within said deposition chamber.

6. The apparatus of claim 5, wherein said injection nozzle assembly and said exhaust assembly each includes a plurality of nozzle ports distributed about said periphery of said substrate.

7. The apparatus of claim 6, and further including adjusting means for adjusting the flow of said mist through said nozzle ports.

8. The apparatus of claim 7, wherein said substrate is circular, said injection nozzle assembly comprises a conduit forming an arc of a circle about one periphery of said substrate, said exhaust assembly comprises a conduit forming an arc of a circle about an opposite periphery of said substrate, and said adjusting means comprises a plurality of threaded ports formed in said injection nozzle assembly and said exhaust assembly and threaded bolts which screw into said threaded ports.

9. The apparatus of claim 6 wherein said injection means comprises a filter for filtering said mist.

10. The apparatus of claim 9 wherein said filter comprises a stainless steel mesh including openings having an area of up to one micron.

11. The apparatus of claim 1, including means for rotating said substrate in a plane parallel to said substrate plane while said mist is being deposited on the substrate.

12. The apparatus of claim 1, including means for applying ultraviolet radiation to said mist while the mist is flowing through the deposition chamber.

13. The apparatus of claim 1, wherein said deposition chamber is maintained at substantially ambient temperature while said mist is flowed into it.

14. The apparatus of claim 1, wherein said means for producing a mist include means for ultrasonically vibrating a quantity of said precursor liquid to form said mist by nebulization.

15. The apparatus of claim 1 and further including a buffer chamber through which said mist passes, said buffer chamber located between said means for producing said mist and said means for flowing said mist.

16. The apparatus of claim 1 and further including means for treating said liquid layer deposited on the substrate to form a film of solid material on said substrate.

17. The apparatus of claim 16 wherein said means for treating comprises a source of ultraviolet radiation for applying UV radiation to said liquid layer on said substrate.

18. The apparatus of claim 16 wherein said means for treating comprises means for drying said liquid layer deposited on said substrate.

19. The apparatus of claim 18 wherein said means for drying comprises means for maintaining a sub-atmospheric pressure in said deposition chamber.

20. The apparatus of claim 1 and further including a source of ultraviolet radiation for applying UV radiation to said mist.

21. Apparatus for fabricating an integrated circuit, said apparatus comprising:
(a) a deposition chamber;
(b) a substrate located within said deposition chamber, said substrate defining a substrate plane;
(c) means for producing a mist of a liquid precursor;
(d) a filter for filtering said mist; and
(e) means for flowing said mist through said deposition chamber to form a layer of the precursor liquid on said substrate.

22. The apparatus of claim 21 wherein said filter comprises a stainless steel mesh.

23. The apparatus of claim 21 wherein said mesh includes openings having an area of up to one micron.

24. An apparatus as in claim 21 wherein said means for flowing comprises:
an injection nozzle assembly for injecting said mist into said deposition chamber disposed in close proximity to and around the periphery of one side of said substrate;
an exhaust assembly disposed in close proximity to and around the periphery of an opposite side of said substrate from said injection nozzle assembly; and
wherein said filter forms part of said injection nozzle assembly.

25. The apparatus of claim 24 wherein said injection nozzle assembly and said exhaust assembly each includes a plurality of nozzle ports distributed about said periphery of said substrate, and said filter is located in at least one of said nozzle ports.

26. The apparatus of claim 25 and further including adjusting means for adjusting the flow of said mist through said nozzle ports, said adjusting means comprising threads formed in said ports formed in said injection nozzle assembly and hollow, threaded bolts which screw into said threaded ports, at least one of said threaded bolts having said filter located in the hollow head of said bolt.

27. The apparatus of claim 26 wherein said substrate is circular, said injection nozzle assembly comprises a conduit forming an arc of a circle about one periphery of said substrate, said exhaust assembly comprises a conduit forming an arc of a circle about an opposite periphery of said substrate, and said ports are formed along said arc of said conduits.

28. The apparatus of claim 24 wherein said means for flowing further includes a barrier plate disposed in spaced relation above said substrate and substantially parallel thereto and wherein said substrate, said barrier plate, said injection nozzle assembly, and said exhaust assembly collectively define a semi-enclosed area within said deposition chamber.

29. The apparatus of claim 28 wherein said filter comprises a stainless steel mesh including openings having an area of up to one micron.

30. A method of fabricating an integrated circuit, said method comprising the steps of:
(a) providing a liquid precursor;
(b) placing a substrate inside an enclosed deposition chamber;
(c) producing a mist of said liquid precursor;
(d) filtering said mist;
(e) flowing said filtered mist through said deposition chamber to form a layer of the precursor liquid on said substrate;
(f) treating the liquid layer deposited on the substrate to form a film of solid material; and (g) completing the fabrication of said integrated circuit to include at least a portion of said film of solid material in a component of said integrated circuit.

31. The method of claim 30 wherein said precursor comprises a metal compound in a precursor solvent, said metal compound selected from the group: a metal alkoxide, a metal carboxylate, and a metal alkoxycarboxylate.

32. The method of claim 30, wherein said step of flowing is performed while maintaining said substrate at ambient temperature.

33. The method of claim 30, wherein said step of flowing said mist through said deposition chamber is performed while maintaining a vacuum of between approximately 100 Torr and 800 Torr in said deposition chamber.

34. The method of claim 30 wherein said step of filtering comprises passing said mist through openings having an area of up to one micron.

35. The method of claim 30, wherein said step of flowing comprises injecting said precursor mist into said deposition chamber in close proximity to and around the periphery of one side of said substrate and exhausting said precursor mist from said deposition chamber at a region in close proximity to and around the periphery of an opposite side of said substrate to create a substantially evenly distributed flow of said precursor mist across the substrate.

36. The method of claim 35, wherein a surface of said substrate defines a substrate plane and said mist is flowed between said substrate and a barrier plate located within said deposition chamber in a spaced relation to said substrate and parallel to said substrate plane.

37. The method of claim 30 and further including the step of passing said mist through a buffer chamber prior to said step of flowing.

38. The method of claim 37, wherein said step of passing said mist through a buffer chamber is performed prior to said step of filtering.

39. The method of claim 30, including the additional step of applying ultraviolet radiation to said mist while said mist is flowing through the deposition chamber.

40. The method of claim 30 wherein said step of treating comprises applying ultraviolet radiation to said layer deposited on said substrate.

41. Apparatus for fabricating an integrated circuit, said apparatus comprising:
(a) a deposition chamber;
(b) a substrate located within said deposition chamber, said substrate defining a substrate plane;
(c) means for producing a mist of a liquid precursor;
(d) means for flowing said mist through said deposition chamber to form a layer of the precursor liquid on said substrate; and
(e) means for reducing the particle size in said mist prior to flowing it through said deposition chamber.

42. Apparatus as in claim 41 wherein said means for reducing the particle size in said mist comprises a buffer chamber through which said mist passes, said buffer chamber located between said means for producing said mist and said means for flowing said mist.

43. Apparatus as in claim 42 wherein said buffer chamber comprises a container that is sufficiently large that mist particles which can cause surface morphology problems settle out in said buffer chamber.

44. Apparatus as in claim 42 wherein said buffer chamber is sufficiently large that particles of size greater than two microns settle out in said buffer chamber.

45. Apparatus as in claim 41 wherein said means for reducing the particle size of said mist comprises a filter for filtering said mist.

46. The apparatus of claim 45 wherein said filter comprises a stainless steel mesh.

47. The apparatus of claim 46 wherein said mesh includes openings having an area of up to one micron.

48. The apparatus of claim 41 wherein said apparatus includes a means for applying a DC bias between an element within said deposition chamber and said substrate.

49. A method of fabricating an integrated circuit, said method comprising the steps of:
(a) providing a liquid precursor;
(b) placing a substrate inside an enclosed deposition chamber;
(c) producing a mist of said liquid precursor;
(d) reducing the particle size of said mist;
(e) flowing said reduced particle size mist through said deposition chamber to form a layer of the precursor liquid on said substrate;
(f) treating the liquid layer deposited on the substrate to form a film of solid material; and
(g) completing the fabrication of said integrated circuit to include at least a portion of said film of solid material in a component of said integrated circuit.

50. A method as in claim 49 wherein said step of reducing the particle size of said mist comprises flowing said mist through a buffer chamber.

51. A method as in claim 50 wherein said buffer chamber comprises a container that is sufficiently large that mist particles which can cause surface morphology problems settle out in said buffer chamber.

52. A method as in claim 50 wherein said buffer chamber is sufficiently large that particles of size greater than two microns settle out in said buffer chamber.

53. A method as in claim 49 wherein said step of reducing the particle size of said mist comprises filtering said mist.

54. The method of claim 53 wherein said step of filtering comprises filtering through a stainless steel mesh.

55. The method of claim 54 wherein said mesh includes openings having an area of up to one micron.

56. The method of claim 49 and further including the step of applying a DC bias between an element within said deposition chamber and said substrate during said step of flowing.

* * * * *